United States Patent
Kim (10) Patent No.: US 7,968,918 B2
(45) Date of Patent: Jun. 28, 2011

(54) SEMICONDUCTOR PACKAGE

(75) Inventor: Sung Min Kim, Seoul (KR)

(73) Assignee: Hynix Semiconductor Inc., Gyeonggi-do (KR)

(*) Notice: Subject to any disclaimer, the term of this patent is extended or adjusted under 35 U.S.C. 154(b) by 190 days.

(21) Appl. No.: 12/493,290

(22) Filed: Jun. 29, 2009

(65) Prior Publication Data

US 2010/0314742 A1    Dec. 16, 2010

(30) Foreign Application Priority Data

Jun. 15, 2009    (KR) .................. 10-2009-0052742

(51) Int. Cl.
- H01L 23/48    (2006.01)
- H01L 21/70    (2006.01)
- H01L 29/40    (2006.01)
- H01L 23/04    (2006.01)

(52) U.S. Cl. ......... 257/276; 257/502; 257/621; 257/698

(58) Field of Classification Search .................. 257/276, 257/502, 621, 698

See application file for complete search history.

(56) References Cited

U.S. PATENT DOCUMENTS

| 5,438,212 A * | 8/1995 | Okaniwa ................... 257/275 |
| 6,916,685 B2 * | 7/2005 | Yang et al. ................. 438/108 |
| 7,355,267 B2 * | 4/2008 | Kirby et al. ................ 257/621 |
| 2007/0138617 A1 * | 6/2007 | Knighten et al. .......... 257/698 |
| 2007/0215985 A1 * | 9/2007 | Chen ........................... 257/622 |

* cited by examiner

*Primary Examiner* — Matthew C Landau
*Assistant Examiner* — James M Mitchell
(74) *Attorney, Agent, or Firm* — Ladas & Parry LLP (57) ABSTRACT

A semiconductor package includes a semiconductor chip having two or more regions that partially overlap so as to define an overlapping region. Through-holes are defined through the two or more partially overlapping regions. One or more first electrodes are disposed on inner surfaces of the semiconductor chip within the through-holes. One or more second electrodes are disposed so as to be insulated from the first electrodes. The one or more second electrodes are at least partially disposed in the overlapping region. Insulation members are disposed in the through-holes.

20 Claims, 5 Drawing Sheets

SEMICONDUCTOR PACKAGE

CROSS-REFERENCE TO RELATED APPLICATIONS

The present application claims priority to Korean patent application number 10-2009-0052742 filed on Jun. 15, 2009, which is incorporated herein by reference in its entirety.

BACKGROUND OF THE INVENTION

The present invention relates generally to semiconductor technology, and more particularly, to a semiconductor package.

Developments in the semiconductor industry including the semiconductor chip and the package in which the chip is formed has made it possible to both store and process a massive amount of data within a short period of time.

Recently, a stacked semiconductor package, in which at least two semiconductor chips are stacked so as to further increase data storage capacity and data processing speed, has been suggested.

In order to realize the stacked semiconductor package, connection members for electrically connecting two semiconductor chips are needed.

In a conventional stacked semiconductor package, semiconductor chips are electrically connected using mainly conductive wires. However, when stacked semiconductor chips are electrically connected using the conductive wires, the lengths of the conductive wires for connecting the chips will vary depending upon the respective positions of the stacked semiconductor chips, which in turn complicates high speed operation of the stacked semiconductor package.

BRIEF SUMMARY OF THE INVENTION

Embodiments of the present invention include a semiconductor package in which electrodes are formed to pass through stacked semiconductor chips so that the semiconductor package may be applied to a stacked semiconductor package, thereby significantly shortening manufacturing process time and simplifying manufacturing processes.

In one embodiment of the present invention, a semiconductor package comprises a semiconductor chip having through-holes which are defined through at least two regions partially overlapping with each other; one or more first electrodes placed on inner surfaces of the semiconductor chip which are formed by the through-holes; one or more second electrodes insulated from the first electrodes and at least partially placed in an overlapping region of the regions; and insulation members placed in the through-holes.

The through-holes defined in the respective regions may have the sectional shape of any one of a circle, an ellipse, a triangle, a quadrangle and a polygon when viewed from the top.

The first electrodes and the second electrodes may have the shape of a plate and posses the same thickness.

A length of the overlapping region may be formed to be less than two times a thickness of the first electrodes, and one second electrode is placed in the overlapping region.

The second electrodes may have the sectional shape of an 'X' when viewed from the top.

A length of the overlapping region may also be greater than two times a thickness of the first electrodes, so that two second electrodes are placed in the overlapping region.

The second electrodes may then have the sectional shape of a caret mark when viewed from the top.

The semiconductor package may further comprise first is wiring lines placed on at least one of a first surface and a second surface of the semiconductor chip and electrically connected with the respective first electrodes; and a second wiring line placed on at least one of the first surface and the second surface of the semiconductor chip and electrically connected with the second electrodes.

The first wiring lines may have first wiring parts which cover surfaces of the first electrodes, and the second wiring line may have a second wiring part which covers surfaces of the second electrodes.

The semiconductor package may further comprise third electrodes covering surfaces of the first electrodes; and fourth electrodes covering surfaces of the second electrodes.

The first and second electrodes may contain a first metal, and the third and fourth electrodes may contain a second metal different from the first metal.

The first metal has a first melting point, and the second metal may have a second melting point that is lower than the first melting point.

Additionally, three regions may be placed to be inscribed in a virtual circle.

The regions may also be arranged in line.

The first electrodes may include first pads which are electrically connected to ends of the first electrodes, and the second electrodes may include a second pad which is electrically connected to ends of the second electrodes and is insulated from the first pads.

The first and second pads may be partially placed on the insulation members.

The first and second pads may also be placed on the semiconductor chip to be separated from the through-holes.

The area of the overlapping region may be 1% to 10% of the area of each of the regions of the semiconductor chip.

The overlapping region may have the sectional shape of an ellipse, a triangle, a quadrangle or a polygon when viewed from the top.

The insulation members may contain any one of an organic substance or an inorganic substance.

DESCRIPTION OF SPECIFIC EMBODIMENTS

Hereafter, specific embodiments of the present invention will be described in detail with reference to the accompanying drawings.

Figure 1:
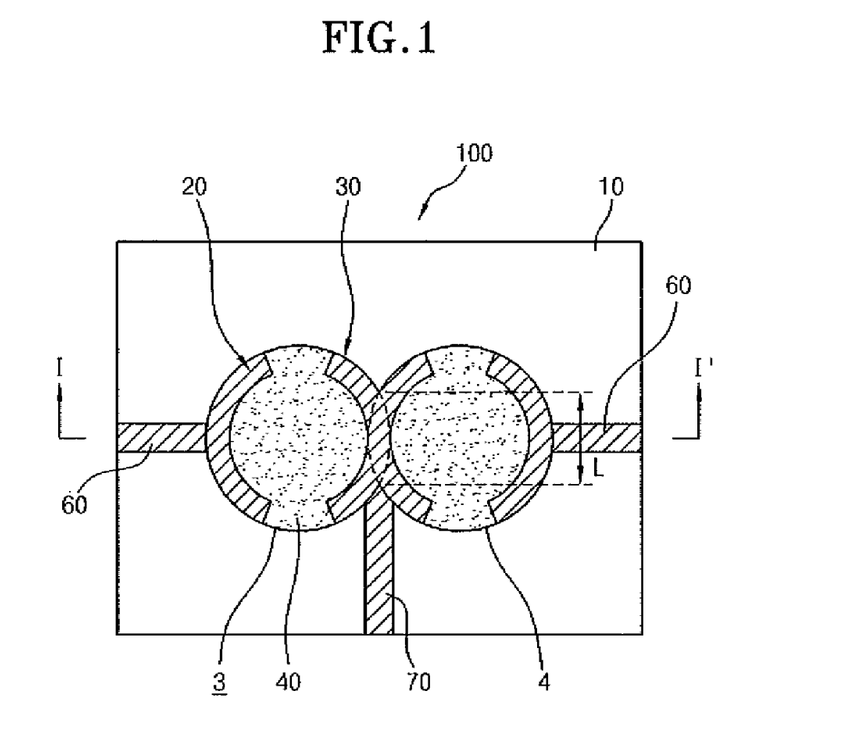
FIG. 1 is a plan view showing a semiconductor package in accordance with an embodiment of the present invention.
Figure 2:
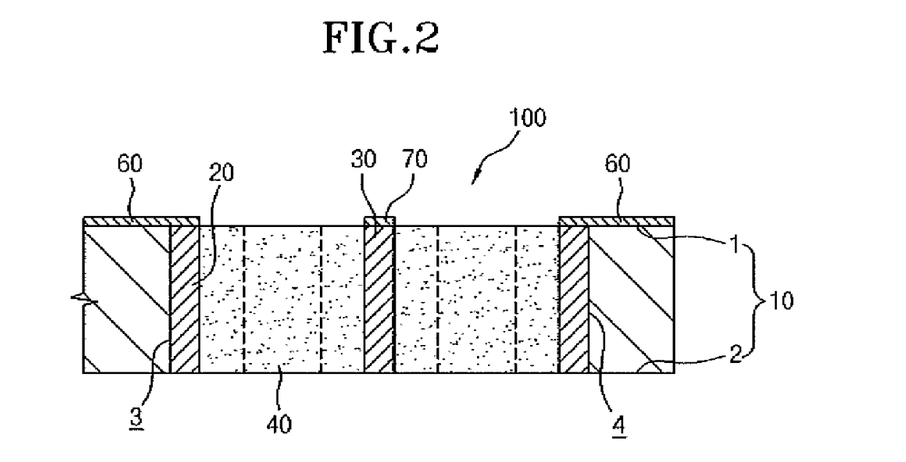
FIG. 2 is a cross-sectional view taken along the line I-I' of FIG. 1.

FIG. 1 is a plan view showing a semiconductor package in accordance with an embodiment of the present invention. FIG. 2 is a cross-sectional view taken along the line I-I' of FIG. 1.

Referring to FIGS. 1 and 2, a semiconductor package 100 includes a semiconductor chip 10, first electrodes 20, a second electrode 30, and insulation members 40.

The semiconductor chip 10 may have the sectional shape of, for example, a rectangle or a square; however, it should be understood that the semiconductor chip 10 is not limited to this shape. The semiconductor chip 10 includes a circuit section (not shown) which has a data storage unit (not shown) for storing data and/or a data processing unit (not shown) for processing data.

The semiconductor chip 10 has a first surface 1 and a second surface 2 which faces away from the first surface 1. The semiconductor chip 10 possesses at least two partially overlapping regions so as to form at least one overlapping region, as is shown in FIG. 1. In an embodiment, for example the embodiment shown in FIG. 1, the respective regions may have the sectional shape of a circle when viewed from the top of the semiconductor chip 10. Alternatively, the respective regions may have the sectional shape of an ellipse, a triangle, a quadrangle, a polygon, etc., when viewed from the top of the semiconductor chip 10.

In an embodiment, the semiconductor chip 10 includes through-holes 3 and 4 which pass through the semiconductor chip 10 from the first surface 1 to the second surface 2.

In the embodiment shown in FIG. 1, the respective through-holes 3 and 4 are defined at positions corresponding to the respective regions. That is, the through-hole 3 is formed in so as to define one of the regions, and the through-hole 4 is formed in so as to define the other of the regions, whereby the through-holes 3 and 4 partially overlap. Since the through-holes 3 and 4 are defined in such a way as to partially overlap with each other, an opening is defined at the overlapping portion of the regions. Thus, the through-holes 3 and 4 communicate with each other by the opening. That is, the through-holes 3 and 4 are joined at the union of the through-holes at which the overlapping portion is formed.

In an embodiment, the area of the overlapping region may be about 1% to 10% of the area of the individual through-holes 3 and 4. In an embodiment, the overlapping region may have the sectional shape of an eye, an ellipse, a triangle, a quadrangle or a polygon when viewed from the top of the semiconductor chip 10. The The first electrodes 20 are disposed on inner surfaces which are formed by the through-holes 3 and 4 (that is, first electrodes 20 are disposed on the surface within the through-holes). In an embodiment, at least two first electrodes 20, one in each through hole, may be disposed on the inner surfaces. In an embodiment, the first electrodes 20 may contain a metal such as copper; and further, insulation layers (not shown) may be placed between the first electrodes 20 and the inner surfaces, and metal seed layers (not shown) may be placed between the insulation layers and the first electrodes 20. In an embodiment, for example the embodiment shown in FIGS. 1-2, the first electrodes 20 are placed on the inner surfaces in the form of a plate having a uniform first thickness.

The second electrode 30 is disposed on the inner surfaces of the semiconductor chip within the through-holes 3 and 4 with at least a portion of the second electrode 30 being formed in the overlapping region. In an embodiment, a second electrode is formed on an inner surface of each of the two regions and the second electrodes in each of the two regions are in communication with each other so as to result in the second electrode 30. That is, when second electrodes are formed in each of the regions so as to be in communication with each other, at least a portion of the resulting second electrode 30 is formed so as to be placed within the overlapping region, while the remaining portions of the second electrode 30 is disposed on the inner surfaces.

In an embodiment, the second electrode 30 may contain a metal such as copper. Further, in an embodiment, the first electrodes 20 and the second electrode 30 contain the same metal. In an embodiment, insulation layers (not shown) may be disposed between the second electrode 30 and the inner surfaces of the semiconductor chip within the through-holes, and metal seed layers (not shown) may be interposed between the insulation layers and the second electrode 30. The second electrodes which together result in the second electrode 30 are formed on the inner surfaces to have a uniform second thickness. In an embodiment, for example the embodiment shown in FIGS. 1-2, the first electrodes 20 and the second electrodes which together result in the second electrode 30 have the shape of a plate, and further, in an embodiment, the first thickness of the first electrodes 20 is substantially the same as the second thickness of the second electrodes that together form the second electrode 30.

The insulation members 40 are disposed in the through-holes 3 and 4. The respective insulation members 40 electrically insulate the first and second electrodes 20 and 30 from each other and prevent the presence of air in the through-holes 3 and 4. It is desirable to remove the presence of air within the through-holes 3 and 4 since air expands under high temperature conditions, which could then cause breakage or damage to the semiconductor chip. In an embodiment, the insulation members 40 may contain any one of an organic substance and an inorganic substance.

In an embodiment, the first and second via holes 3 and 4 are defined such that the length L of the overlapping region shown in FIG. 1 is less than two times the thickness of the respective first electrodes 20. When the length L of the overlapping region is designed to be less than two times the thickness of the first electrodes 20, only one of the second electrodes that together form the second electrode 30 is formed in the overlapping region. Further, when viewed from the top of the semiconductor chip 10, the second electrode 30 has a shape similar to an 'X'.

Referring to FIGS. 1 and 2, in an embodiment the semiconductor package 100 further includes first wiring lines 60 and a second wiring line 70.

The first wiring lines 60 may be disposed on the first surface 1 and/or the second surface 2 of the semiconductor chip 10. In an embodiment, the first wiring lines 60 are electrically connected to ends of the first electrodes 20 as shown in FIG. 1. In an embodiment, the first wiring lines 60 may contain substantially the same metal as the first electrodes 20. Alternatively, the first wiring lines 60 may contain a metal different from that of the first electrodes 20.

The second wiring line 70 may be disposed on the first surface 1 and/or the second surface 2 of the semiconductor chip 10. In an embodiment, the second wiring line 70 is electrically connected to ends of the second electrodes that together form the second electrode 30 as illustrated in FIGS. 1-2. In an embodiment, the second wiring line 70 contains substantially the same metal as the second electrode 30. Alternatively, the second wiring line 70 may contain a metal different from that of the second electrode 30.

Figure 3:
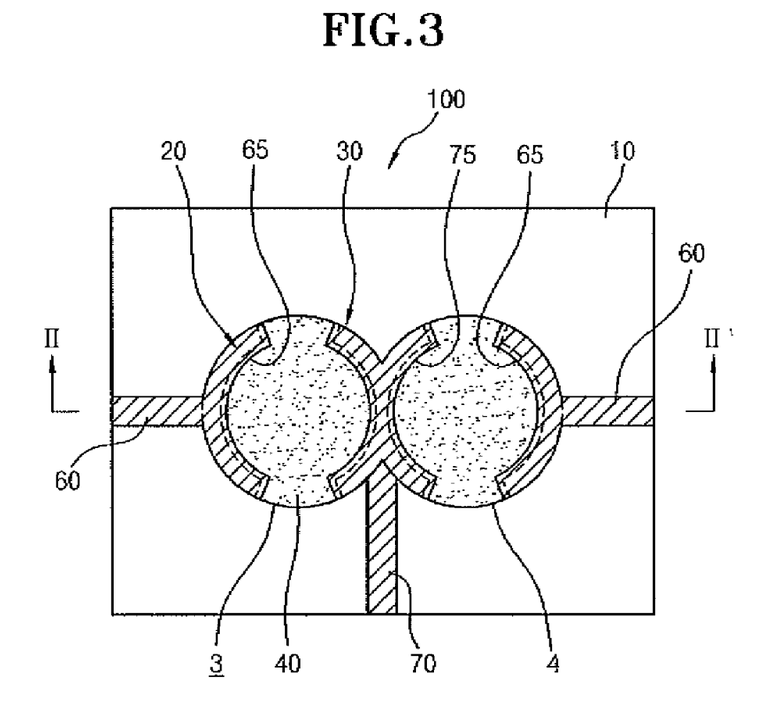
FIG. 3 is a plan view showing a semiconductor package in accordance with another embodiment of the present invention.
Figure 4:
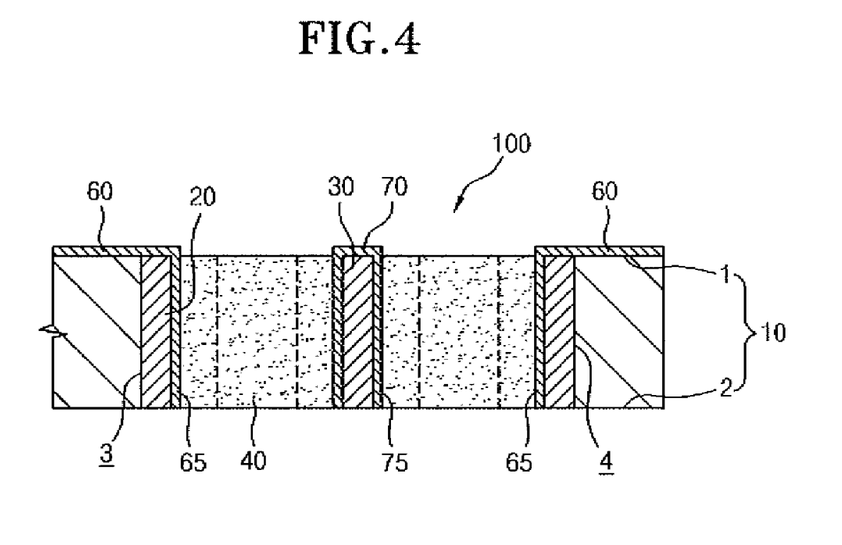
FIG. 4 is a cross-sectional view taken along the line II-II' of FIG. 3.

FIG. 3 is a plan view showing a semiconductor package in accordance with another embodiment of the present invention. FIG. 4 is a cross-sectional view taken along the line II-II' of FIG. 3. The semiconductor package according to an embodiment shown in FIG. 3 is substantially the same as the semiconductor package described above with reference to FIGS. 1 and 2, except for first and second wiring parts of first and second wiring lines, which are described in detail below. Therefore, a detailed description of the same component elements will be omitted herein, and the same technical terms and the same reference numerals will be used to refer to the same or like component elements.

Referring to FIGS. 3 and 4, a semiconductor package 100 includes a semiconductor chip 10, first electrodes 20, second electrodes 30, insulation members 40, first wiring lines 60, and a second wiring line 70.

In an embodiment, the first wiring lines 60 have first wiring parts 65 which cover at least a portion of the surfaces of the first electrodes 20 including the surfaces within the through holes 3 and 4. In another embodiment, the first wiring parts 68 cover the entire surface of the respective first electrodes 20 including within the through holes 3 and 4.

In an embodiment, the first wiring lines 60 having the first wiring parts 65 contain the same substance as the first electrodes 20. In an alternative embodiment, the first wiring lines 60 having the first wiring parts 65 contain a substance different from that of the first electrodes 20. For example, in an embodiment, the first wiring lines 60 having the first wiring parts 65 may contain solder, and the first electrodes 20 may contain copper.

In an embodiment, the second wiring line 70 has a second wiring part 75 which covers at least a portion of the surfaces of the second electrode 30 including the surfaces within the through holes 3 and 4. In another embodiment, the first wiring parts 68 cover the entire surface of the second electrode 30 including within the through holes 3 and 4.

In an embodiment, the second wiring line 70 having the second wiring part 75 contains the same substance as the second electrode 30. In an alternative embodiment, the second wiring line 70 having the second wiring part 75 may contain a substance different from that of the second electrode 30. For example, in an embodiment, the second wiring line 70 having the second wiring part 75 may contain solder, and the second electrode 30 may contain copper.

In the embodiment in which the first wiring parts 65 of the first wiring lines 60 and the second wiring part 75 of the second wiring line 70 contain solder, at least two semiconductor chips 10 may be stacked and electrically connected using the first wiring parts 65 and the second wiring part 75 without needing separate connection members.

Figure 5:
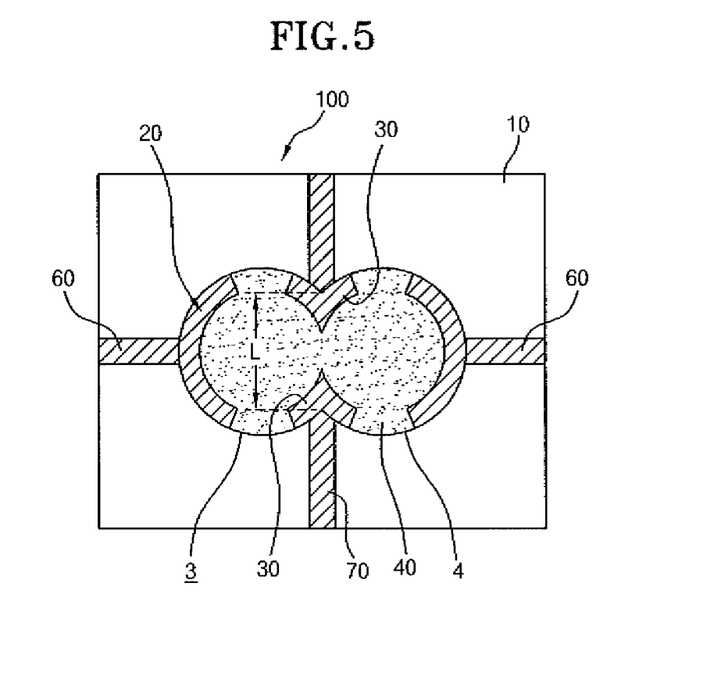
FIG. 5 is a plan view showing a semiconductor package in accordance with another embodiment of the present invention.

FIG. 5 is a plan view showing a semiconductor package in accordance with another embodiment of the present invention. The semiconductor package according to an embodiment shown in FIG. 5 is substantially the same as the semiconductor package described above with reference to FIGS. 1 and 2, except the second electrodes, which will be described in detail below.

Referring to FIG. 5, a semiconductor package 100 includes a semiconductor chip 10, first electrodes 20, second electrodes 30, and insulation members 40.

The second electrodes 30 are disposed on the inner surfaces of the semiconductor chip 10 which are formed by the through-holes 3 and 4 (that is, the second electrodes are placed on the inner surfaces of the semiconductor chip 10 that are within the through electrode). At least a portion of the respective second electrodes 30 are disposed within the overlapping region, and the remaining portions of the second electrodes 30 are disposed on the inner surfaces.

In an embodiment, the second electrodes 30 may contain a metal such as copper. Further, in an embodiment, the first electrodes 20 and the second electrodes 30 contain the same metal. In an embodiment, insulation layers (not shown) may be disposed between the second electrodes 30 and the inner surfaces, and metal seed layers (not shown) may be disposed between the insulation layers and the second electrodes 30. In an embodiment, each of the second electrodes 30 comprises a second electrode formed in one of the regions and a second electrode formed in the other region; that is, in an embodiment a second electrode is formed in each through-hole and are in communication with each other where the second electrodes 30 shown in FIG. 5 are formed. The second electrodes formed in each of the through-holes, which together form the two second electrodes 30, are formed on the inner surfaces to have a uniform second thickness. In the embodiment shown in FIG. 5, the first thickness of the first electrodes 20 is substantially the same as the second thickness of the second electrodes which together form the second electrodes 30.

The length L of the overlapping region shown in FIG. 5 may be greater than two times the thickness of the first electrodes 20. In an embodiment, when the length L of the overlapping region is greater than two times the thickness of the first electrodes 20, two parts (the two parts constitute the second electrodes 30) of the second electrodes formed in the two through-holes are formed in the overlapping region in such a way as to be separated from each other; and when viewed from the top of the semiconductor chip 10, the second electrodes 30 formed by the second electrodes formed in each of the two regions have a shape similar to a caret mark.

In the present embodiment, second wiring lines 70 are electrically connected to the second electrodes 30 which are partially placed in the overlapping region and are separated into the two parts.

Figure 6:
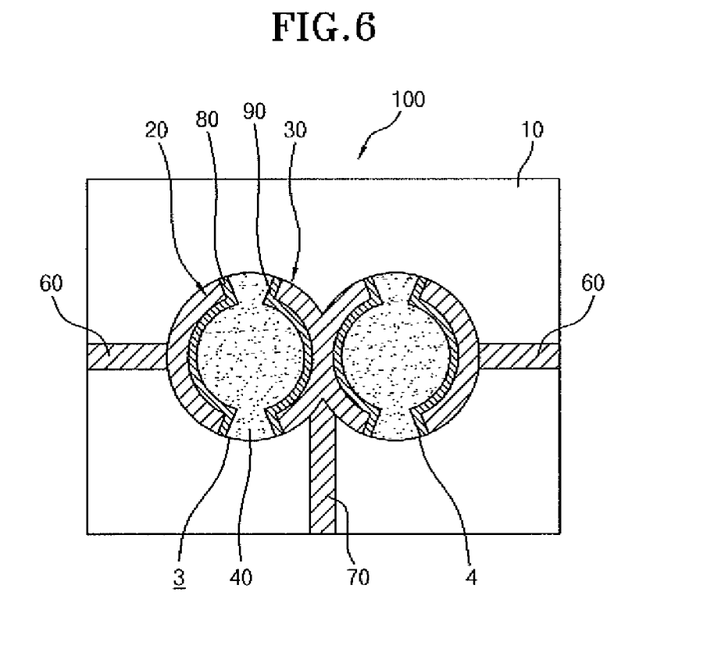
FIG. 6 is a plan view showing a semiconductor package in accordance with another embodiment of the present invention.

FIG. 6 is a plan view showing a semiconductor package in accordance with another embodiment of the present invention. The semiconductor package according to an embodiment shown in FIG. 6 is substantially the same as the semiconductor package described above with reference to FIGS. 1 and 2, except for the third and fourth electrodes as will be described in detail below. Therefore, a detailed description for the same component elements will be omitted herein, and the same technical terms and the same reference numerals will be used to refer to the same or like component elements.

A semiconductor package 100 includes a semiconductor chip 10, first electrodes 20, a second electrode 30, insulation members 40, third electrodes 80, and fourth electrodes 90.

The third electrodes 80 cover the surfaces of the first electrodes 20, and the fourth electrodes 90 cover the surfaces of the second electrode 30 (e.g. the second electrodes formed in each of the through-holes which together form the second electrode 30). In the present embodiment, the first and second electrodes 20 and 30 contain a first metal, and the third and fourth electrodes 80 and 90 contain a second metal. In the present embodiment, the first metal has a first melting point, and the second metal may have a second melting point that is lower than the first melting point.

In the present embodiment, the first metal may be copper, and the second metal may be solder. In the present embodiment, when the third and fourth electrodes 80 and 90 are formed on the surfaces of the first electrodes 20 and the second electrode 30, not only can the electrical characteristics of the first and second electrodes 20 and 30, which may have a very thin thickness, be improved, but also at least two semiconductor chips may be stacked and electrically connected to each other using the third and fourth electrodes 80 and 90.

In the present embodiment, the third electrodes 80 may be covered by first wiring parts which extend from the first wiring lines 60, and the fourth electrodes 90 may be covered by a second wiring part which extends from the second wiring line 70. In the present embodiment, the first and second wiring parts which cover the third and fourth electrodes 80 and 90 may significantly reduce the electric resistance of the first through fourth electrodes 20, 30, 80 and 90.

Figure 7:
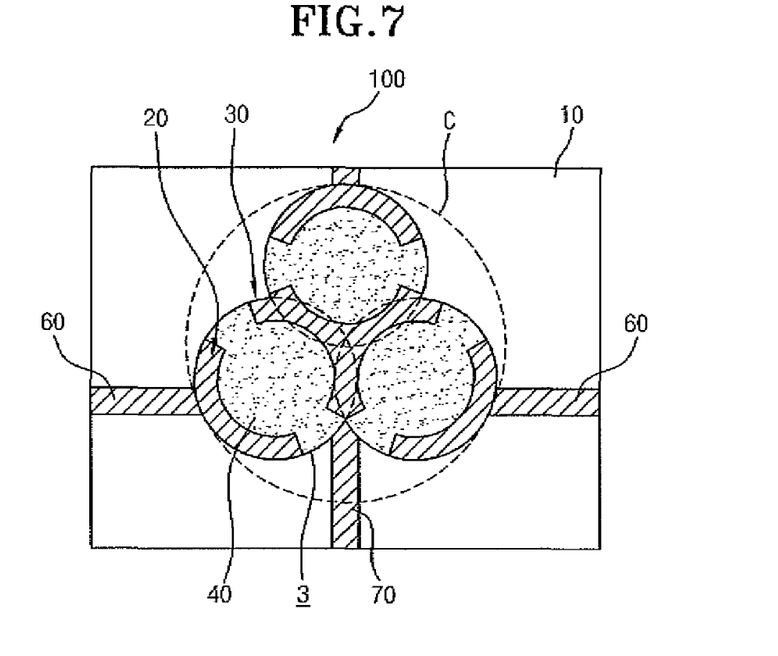
FIG. 7 is a plan view showing a semiconductor package in accordance with another embodiment of the present invention.

FIG. 7 is a plan view showing a semiconductor package in accordance with another embodiment of the present invention. The semiconductor package shown in FIG. 7 has substantially the same construction as the semiconductor package described above with reference to FIG. 1, except the number and the arrangement of through-holes as will be described below in detail. Therefore, a detailed description for the same component elements will be omitted herein, and the same technical terms and the same reference numerals will be used to refer to the same or like component elements.

Referring to FIG. 7, in an embodiment of the present invention, three regions are formed in a semiconductor chip 10, and each of the three regions has the sectional shape of a circle when viewed from the top of the semiconductor chip. These three regions are inscribed in a virtual circle C. In the present embodiment, since three through-holes 3, which define the three regions, are defined in such a way as to be inscribed in the virtual circle C, the area occupied by the through-holes 3 may be decreased. Alternatively, four regions may be located in the virtual circle C in the form of a cross. In the embodiment shown in FIG. 7, each of the through-holes 3 includes a first electrode 20 and a second electrode (which are in communication with each other and together form the second electrode 30). Further, as shown in FIG. 7, the through-holes 3 form three overlapping regions, and a portion of the second electrode 30 is formed in each of the overlapping regions. Further, in an embodiment, each of the three overlapping regions also overlaps at a position where all three through-holes 3 overlap.

Figure 8:
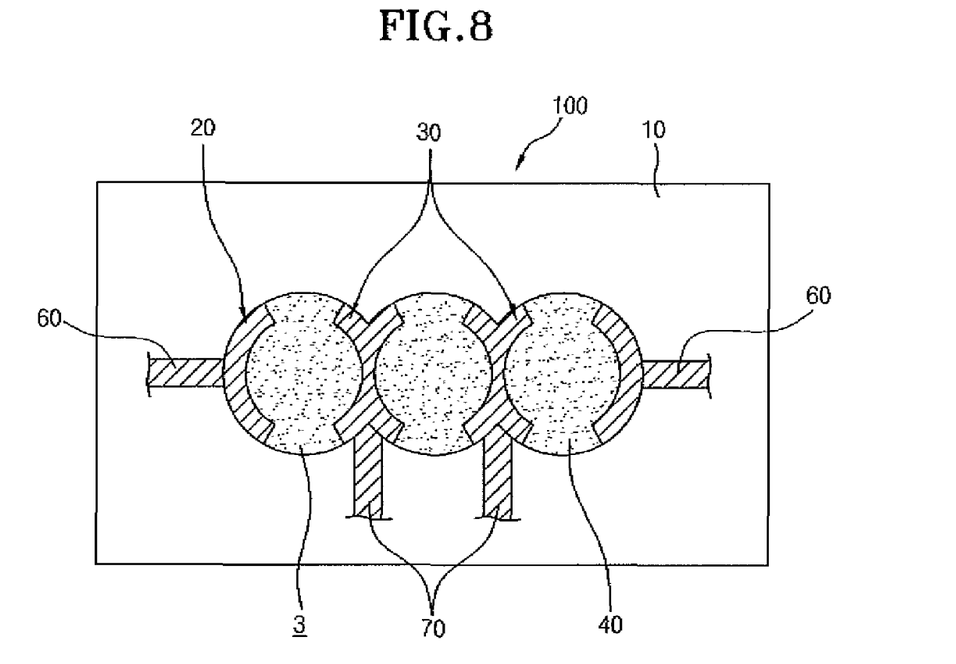
FIG. 8 is a plan view showing a semiconductor package in accordance with another embodiment of the present invention.

FIG. 8 is a plan view showing a semiconductor package in accordance with another embodiment of the present invention. The semiconductor package shown in FIG. 8 has substantially the same construction as the semiconductor package described above with reference to FIG. 1, except the number and the arrangement of through-holes which will be described in detail below. Therefore, a detailed description for the same component elements will be omitted herein, and the same technical terms and the same reference numerals will be used to refer to the same or like component elements.

Referring to FIG. 8, regions of a semiconductor chip 10 are arranged in a line when viewed from the top of the semiconductor chip 10. In an embodiment, the regions arranged in line overlap with one another. Consequently, as through-holes are defined in the semiconductor chip 10 to be arranged in line, when compared to a case in which through-holes are defined in more dense manner, it is possible to prevent the semiconductor chip 10 from being damaged, and first and second wiring lines 60 and 70 may be freely formed. As shown in FIG. 8, first and second electrodes 20 and 30 can be disposed in a manner similar to that described above.

Figure 9:
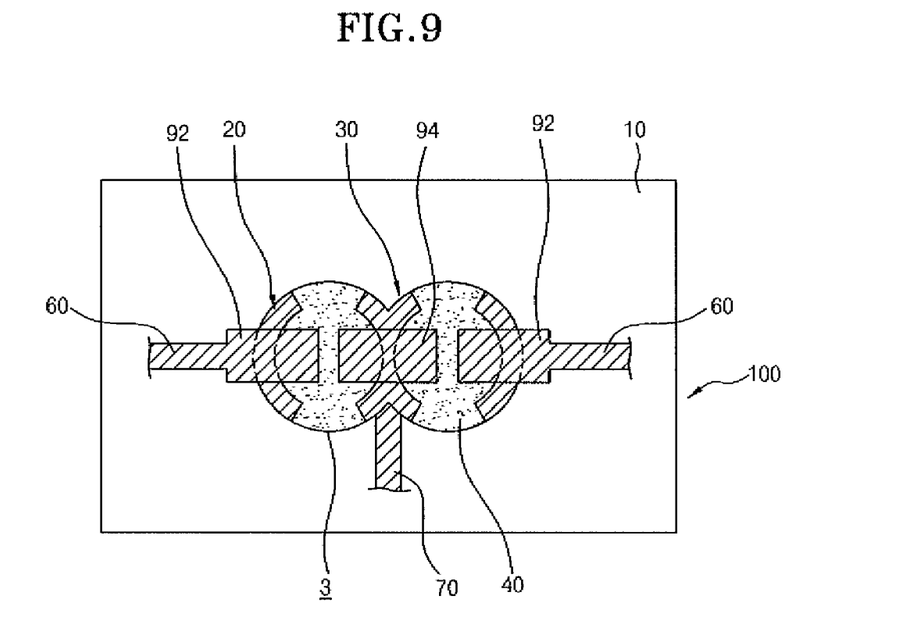
FIG. 9 is a plan view showing a semiconductor package in accordance with another embodiment of the present invention.

FIG. 9 is a plan view showing a semiconductor package in accordance with another embodiment of the present invention. The semiconductor package shown in FIG. 9 has substantially the same construction as the semiconductor package described above with reference to FIG. 1, except first and second pads which will be described in detail below. Therefore, a detailed description for the same component elements will be omitted herein, and the same technical terms and the same reference numerals will be used to refer to the same or like component elements.

Referring to FIG. 9, a semiconductor package 100 includes a semiconductor chip 10, first electrodes 20, a second electrode 30 (which may comprise a second electrode formed in each of the through-holes), insulation members 40, first pads 92, and a second pad 94.

In the semiconductor package 100 according to an embodiment, the ends of the first electrodes 20 and the second electrode 30 have very small horizontal areas. Because the first and second electrodes 20 and 30 have the very small horizontal areas, when two or more semiconductor chips 10 are stacked, the ends of the first and second electrodes 20 and 30 which face out may not be electrically connected to ends of first and second electrodes 20 and 30 of another semiconductor chip due to misalignment of the first and second electrodes 20 and 30.

Figure 10:
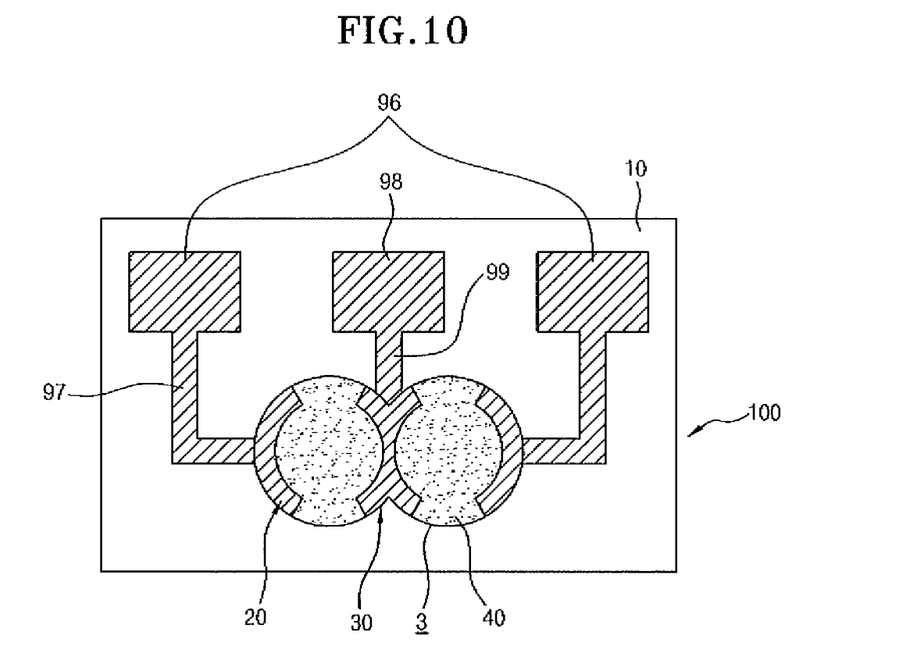
FIG. 10 is a plan view showing a semiconductor package in accordance with another embodiment of the present invention. It is understood herein that the drawings are not necessarily to scale and in some instances proportions may have been exaggerated in order to more clearly depict certain features of the invention.

In the embodiment shown in FIG. 10, the first and second pads 92 and 94 are electrically connected to the first and second electrodes 20 and 30.

The first pads 92 are electrically connected to the first electrodes 20. In an embodiment, the first pads 92 are integrally formed with the first electrodes 20. Further, portions of the first pads 92 are disposed on the insulation members 40. The first pads 92 function to increase the horizontal areas of the first electrodes 20.

The second pad 94 is electrically connected to the second electrode 30. In an embodiment, the second pad 94 is integrally formed with the second electrode 30. Portions of the second pad 94 are disposed on the insulation members 40 formed in the respective through-holes. The second pad 94 functions to increase the horizontal area of the second electrode 30.

FIG. 10 is a plan view showing a semiconductor package in accordance with another embodiment of the present invention. The semiconductor package shown in FIG. 10 has substantially the same construction as the semiconductor package described above with reference to FIG. 1, except first and second pads which will be described in detail below. Therefore, a detailed description for the same component elements will be omitted herein, and the same technical terms and the same reference numerals will be used to refer to the same or like component elements.

Referring to FIG. 10, a semiconductor package 100 includes a semiconductor chip 10, first electrodes 20a, second electrode 30 (which may comprise a second electrode formed in each of the through-holes), insulation members 40, first pads 96, and a second pad 98.

In the semiconductor package 100 according to an embodiment, the ends of the first electrodes 20 and the second electrodes 30 have very small horizontal areas. Because the first and second electrodes 20 and 30 have the very small horizontal areas, when at least two semiconductor chips 10 are stacked, the ends of the first and second electrodes 20 and 30 which face out may not be electrically connected to ends of first and second electrodes 20 and 30 of another semiconductor chip due to misalignment of the first and second electrodes 20 and 30. To increase the horizontal connection area, the first and second pads 96 and 98, which are disposed on the semiconductor chip 10, are electrically connected to the first and second electrodes 20 and 30.

The first pads 96 are electrically connected to the first electrodes 20 by conductive patterns 97. In an embodiment, the conductive patterns 97 are disposed on the semiconductor chip 10. The first pads 96 function to increase the horizontal areas of the ends of the first electrodes 20.

The second pad 98 is electrically connected to the second electrode 30 by a conductive pattern 99. In an embodiment, the conductive pattern 99 is disposed on the semiconductor chip 10. The second pad 98 functions to increase the horizontal area of the end of the second electrode 30.

In the present embodiment, in the state in which at least two semiconductor chips 10 are stacked, even when the first and second electrodes 20 and 30 are not electrically connected to each other due to misalignment, the stacked semiconductor chips 10 may still be electrically connected to each other by the first and second pads 96 and 98.

As is apparent from the above description, in the present invention, the time required to form electrodes passing through semiconductor chips so as to electrically connect at least two semiconductor chips may be significantly shortened, and it is possible to prevent voids from being produced in thorough-holes.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a semiconductor chip having through-holes that pass through at least two regions, which are partially overlapped with each other, of the semiconductor chip so that an overlapping region is formed by the through-holes;
   at least one first electrode disposed over inner surfaces of the semiconductor chip within the through-holes;
   at least one second electrode insulated from the first electrode and at least partially disposed in the overlapping region; and
   insulation members disposed in the through-holes.

2. The semiconductor package according to claim 1, wherein the through-holes defined in the respective regions have a sectional shape of any one of a circle, an ellipse, a triangle, a quadrangle and a polygon when viewed from the top of the semiconductor chip.

3. The semiconductor package according to claim 1, wherein the first and second electrodes within the through-holes have the shape of the plate and the first and second electrodes have the same thickness.

4. The semiconductor package according to claim 1, wherein a length of the overlapping region is less than two times a thickness of the first electrode so that one second electrode is placed in the overlapping region.

5. The semiconductor package according to claim 4, wherein the second electrode has the sectional shape of an 'X' when viewed from the top of the semiconductor chip.

6. The semiconductor package according to claim 1, wherein a length of the overlapping region is greater than two times a thickness of the first electrode so that two second electrodes that are separated to each other are disposed in the overlapping region.

7. The semiconductor package according to claim 6, wherein the second electrodes have the sectional shape of a caret mark or a herringbone mark when viewed from the top of the semiconductor chip.

8. The semiconductor package according to claim 1, further comprising:
   at least one first wiring line disposed on at least one of a first surface and a second surface opposite the first surface of the semiconductor chip, the first wiring line being electrically connected to the first electrode; and
   a second wiring line disposed on at least one of the first surface and the second surface of the semiconductor chip, the second wiring line being electrically connected to the second electrode.

9. The semiconductor package according to claim 8, wherein:
   the first wiring line comprises a first wiring part which cover surfaces of the first electrodes, and
   the second wiring line comprises a second wiring part which covers surfaces of the second electrode.

10. The semiconductor package according to claim 1, further comprising:
    third electrodes covering surfaces of the first electrodes; and
    fourth electrodes covering surfaces of the second electrodes.

11. The semiconductor package according to claim 10, wherein the first and second electrodes include a first metal, and the third and fourth electrodes include a second metal.

12. The semiconductor package according to claim 11, wherein the first metal has a first melting point, and the second metal has a second melting point that is lower than the first melting point.

13. The semiconductor package according to claim 1, wherein three regions are arranged so as to be inscribed in a virtual circle and a through-hole is formed though the semiconductor chip in each of the three regions.

14. The semiconductor package according to claim 1, wherein the regions of the semiconductor chip are arranged in a line.

15. The semiconductor package according to claim 1, wherein the first electrodes include first pads which are electrically connected to ends of the first electrodes, and the second electrode includes a second pad which is electrically connected to an end of the second electrode and is insulated from the first pads, wherein a horizontal connection area of the first and second pads is greater than that of the first and second electrodes.

16. The semiconductor package according to claim 15, wherein the first and second pads are at least partially disposed on the insulation members.

17. The semiconductor package according to claim 15, wherein the first and second pads are disposed on the semiconductor chip to be separated from the through-holes.

18. The semiconductor package according to claim 1, wherein the area of the overlapping region is 1% to 10% of the area of each of the two or more regions.

19. The semiconductor package according to claim 1, wherein the overlapping region has the sectional shape of an eye, an ellipse, a triangle, a quadrangle or a polygon when viewed from the top of the semiconductor chip.

20. The semiconductor package according to claim 1, wherein the insulation members contain any one of an organic substance or an inorganic substance.

* * * * *